(12) United States Patent
Lang et al.

(10) Patent No.: US 11,966,591 B2
(45) Date of Patent: Apr. 23, 2024

(54) APPARATUS WITH READ LEVEL MANAGEMENT AND METHODS FOR OPERATING THE SAME

(71) Applicant: Micron Technology, Inc., Boise, ID (US)

(72) Inventors: Murong Lang, San Jose, CA (US); Tingjun Xie, Milpitas, CA (US); Fangfang Zhu, San Jose, CA (US); Zhenming Zhou, San Jose, CA (US); Jiangli Zhu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/938,307

(22) Filed: Oct. 5, 2022

(65) Prior Publication Data

US 2023/0393758 A1 Dec. 7, 2023

Related U.S. Application Data

(60) Provisional application No. 63/347,876, filed on Jun. 1, 2022.

(51) Int. Cl.
*G06F 3/06* (2006.01)

(52) U.S. Cl.
CPC .......... *G06F 3/0619* (2013.01); *G06F 3/0629* (2013.01); *G06F 3/0679* (2013.01)

(58) Field of Classification Search
CPC ..... G06F 3/0619; G06F 3/0629; G06F 3/0679
USPC ........................................................ 711/154
See application file for complete search history.

(56) References Cited

U.S. PATENT DOCUMENTS

| | | | |
|---|---|---|---|
| 10,101,931 B1 * | 10/2018 | Camp ................. | G06F 12/0866 |
| 10,379,739 B1 * | 8/2019 | Bazarsky ............ | G11C 11/5642 |
| 2021/0382652 A1 * | 12/2021 | Sharma ................ | G06F 3/0613 |
| 2022/0044737 A1 * | 2/2022 | Khayat ............... | G11C 11/5642 |

\* cited by examiner

*Primary Examiner* — Than Nguyen
(74) *Attorney, Agent, or Firm* — Perkins Coie LLP

(57) ABSTRACT

Methods, apparatuses and systems related to managing deck-specific read levels are described. The apparatus may include a memory array having the memory cells organized into two or more decks. The apparatus can determine a delay between programming the decks. The apparatus can derive and implement the deck-specific read levels by selectively adjusting a base read level with an offset level according to the delay and/or the targeted read location.

20 Claims, 7 Drawing Sheets

APPARATUS WITH READ LEVEL MANAGEMENT AND METHODS FOR OPERATING THE SAME

CROSS-REFERENCE TO RELATED APPLICATION(S)

This application claims benefit of U.S. Provisional Application No. 63/347,876, filed Jun. 1, 2022; The subject matter thereof is incorporated herein by reference thereto. This application also contains subject matter related to a concurrently-filed U.S. Patent Application by Murong Lang, Tingjun Xie, Fangfang Zhu, Jiangli Zhu, and Zhenming Zhou titled "APPARATUS WITH READ LEVEL MANAGEMENT AND METHODS FOR OPERATING THE SAME." The related application is assigned to Micron Technology, Inc.

TECHNICAL FIELD

The disclosed embodiments relate to devices, and, in particular, to semiconductor memory devices with read level management and methods for operating the same.

BACKGROUND

Memory systems can employ memory devices to store and access information. The memory devices can include volatile memory devices, non-volatile memory devices (e.g., flash memory employing "NAND" technology or logic gates, "NOR" technology or logic gates, or a combination thereof), or a combination device. The memory devices utilize electrical energy, along with corresponding threshold levels or processing/reading voltage levels, to store and access data. However, the performance or characteristics of the memory devices change or degrade over time or usage. The change in performance or characteristics conflicts with the threshold or processing voltage levels over time, leading to errors and other performance issues.

BRIEF DESCRIPTION OF THE DRAWINGS

The foregoing and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

DETAILED DESCRIPTION

Figure 1:
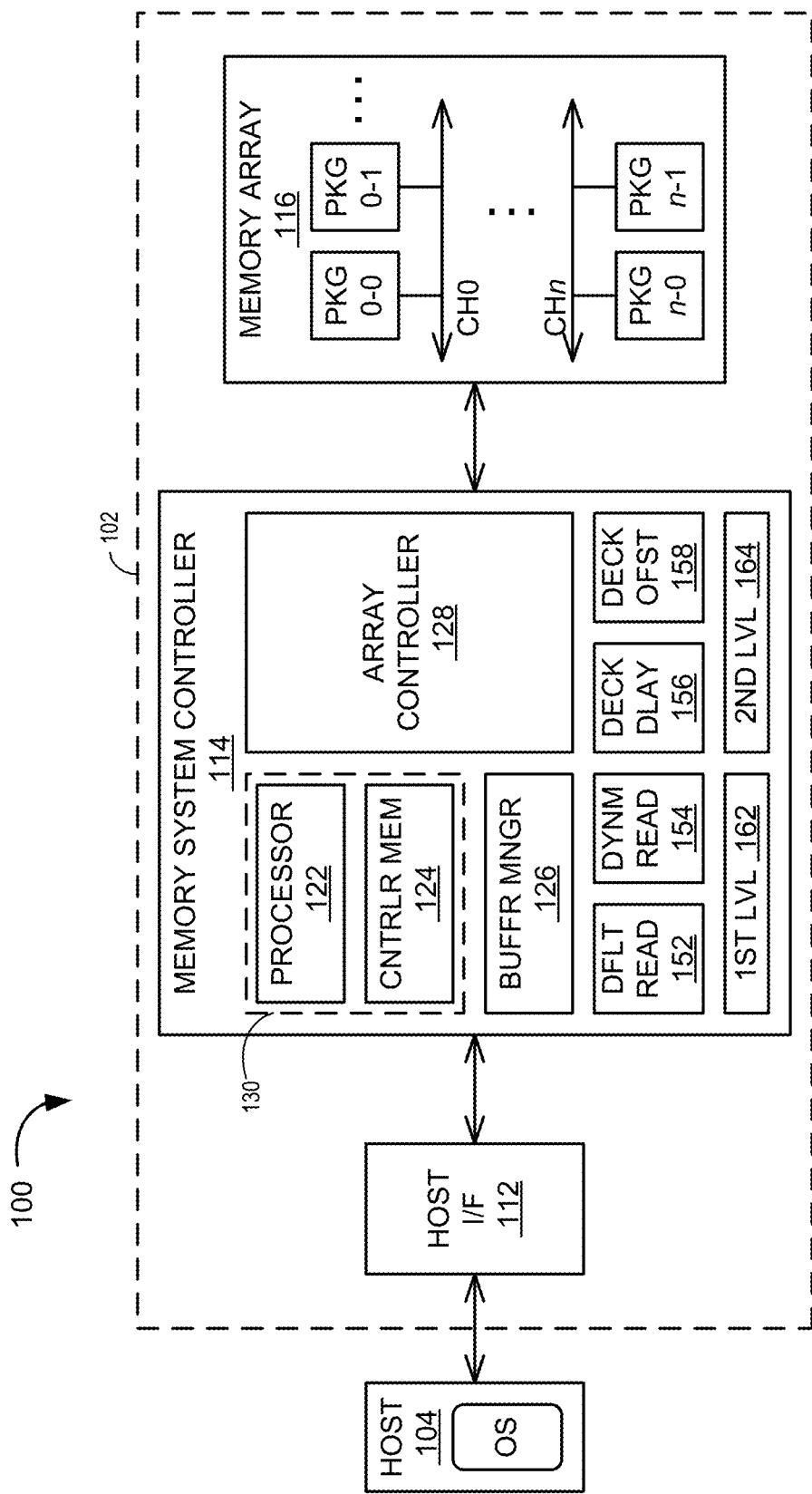
FIG. 1 is a block diagram of a computing system in accordance with an embodiment of the present technology.

As described in greater detail below, the technology disclosed herein relates to an apparatus, such as memory systems, systems with memory devices, related methods, etc., for managing read levels/voltages. A computing system, such as an enterprise computer, a server, a distributed computing system, or the like, may include a memory device configured to store data into different portions at different times.

As an illustrative example, the computing system can include the memory system having a three-dimensional (3D) NAND architecture. Such memory system can have memory cells organized in multiple layers. In some embodiments, word-lines used to access the memory cells can be arranged parallel to the layers (e.g., extending laterally) and bit lines can be arranged orthogonal to the orientation of the layers (e.g., extending vertically). The layers can be grouped into decks (groupings of, e.g., 48, 88, or 96 word lines), which may be written to at different times. For example, the memory system may have the memory cells arranged in two groupings (e.g., an upper deck and a lower deck). For one block of memory, half of the cells in one grouping (e.g., the lower deck) may be programmed before other groupings (e.g., the upper deck). The targeted memory block may remain open until the remaining groupings are programmed, such as after a delay. As the programming delay increases, the differences in the stored charges of the different decks can also increase, which can cause imbalances in reading the stored data. For example, for a given read voltage, the initially programmed cells (e.g., the lower deck) may produce higher error rates than the subsequently programmed cells.

To improve the balance across the different groupings of memory cells, embodiments of the technology described herein may include a time-based read level management mechanism that controls or dynamically adjusts the read levels for the different groupings according to a deck separation delay. The memory system can measure a delay between writes to the different decks. The memory system can use the measured delay to identify an offset value, such as by accessing a predetermined look-up table (LUT). The memory system can apply the offset value when reading from a corresponding deck. For example, the memory system can use (1) a dynamically optimized read level to read from the subsequently programmed deck and (2) the dynamically optimized read level increased by the offset value to read from the initially programmed deck.

The memory system can use the different and/or dynamically adjusted read levels to read the different groupings, and thus provide improved data integrity (e.g., lower error rates) and reduce error recovery trigger rates. Moreover, the memory system leverage existing background reads and/or existing internal processes in implementing the different read levels, thereby maintaining performance measures, such as the Quality of Service (QoS) parameter.

For illustrative purposes, the memory system will be described using a two-deck architecture (e.g., having lower and upper decks). However it is understood that the memory system can include three or more decks, and the memory system can use different read levels for one or more or each of the decks. Also, for illustrative purposes, the memory system will be described as programming the lower deck before the upper deck. However, it is understood that the memory system can program the decks in different sequences and apply the different read levels according to the programming sequence.

Example Environment

FIG. 1 is a block diagram of a computing system 100 in accordance with an embodiment of the present technology. The computing system 100 can include a personal computing device/system, an enterprise system, a mobile device, a server system, a database system, a distributed computing system, or the like. The computing system 100 can include a memory system 102 coupled to a host device 104. The host device 104 can include one or more processors that can write data to and/or read data from the memory system 102, such as during execution of an operating system. For example, the host device 104 can include an upstream central processing unit (CPU).

The memory system 102 can include circuitry configured to store data (via, e.g., write operations) and provide access to stored data (via, e.g., read operations). For example, the memory system 102 can include a persistent or non-volatile data storage system, such as a NAND-based Flash drive system, a Solid-State Drive (SSD) system, a SD card, or the like. In some embodiments, the memory system 102 can include a host interface 112 (e.g., buffers, transmitters, receivers, and/or the like) configured to facilitate communications with the host device 104. For example, the Host interface 112 can be configured to support one or more host interconnect schemes, such as Universal Serial Bus (USB), Peripheral Component Interconnect (PCI), Serial AT Attachment (SATA), or the like. The host interface 112 can receive commands, addresses, data (e.g., write data), and/or other information from the host device 104. The host interface 112 can also send data (e.g., read data) and/or other information to the host device 104.

The memory system 102 can further include a memory system controller 114 and a memory array 116. The memory array 116 can include memory cells that are configured to store a unit of information. The memory system controller 114 can be configured to control the overall operation of the memory system 102, including the operations of the memory array 116.

In some embodiments, the memory array 116 can include a set of NAND Flash devices or packages. Each of the packages can include a set of memory cells that each store data in a charge storage structure. The memory cells can include, for example, floating gate, charge trap, phase change, ferroelectric, magnetoresitive, and/or other suitable storage elements configured to store data persistently or semi-persistently. The memory cells can be one-transistor memory cells that can be programmed to a target state to represent information. For instance, electric charge can be placed on, or removed from, the charge storage structure (e.g., the charge trap or the floating gate) of the memory cell to program the cell to a particular data state. The stored charge on the charge storage structure of the memory cell can indicate a threshold voltage (Vt) of the cell. For example, a single level cell (SLC) can be programmed to a targeted one of two different data states, which can be represented by the binary units 1 or 0. Also, some flash memory cells can be programmed to a targeted one of more than two data states. Multilevel cells (MLCs) may be programmed to any one of four data states (e.g., represented by the binary 00, 01, 10, 11) to store two bits of data. Similarly, triple level cells (TLCs) may be programmed to one of eight (i.e., 23) data states to store three bits of data, and quad level cells (QLCs) may be programmed to one of 16 (i.e., 24) data states to store four bits of data. Such memory cells may be arranged in rows (e.g., each corresponding to a word line 143) and columns (e.g., each corresponding to a bit line). The arrangements can further correspond to different groupings for the memory cells. For example, each word line can correspond to one or more memory pages. Also, the memory array 116 can include memory blocks that each include a set of memory pages. In operation, the data can be written or otherwise programmed (e.g., erased) with regards to the various memory regions of the memory array 116, such as by writing to groups of pages and/or memory blocks. In NAND-based memory, a write operation often includes programming the memory cells in selected memory pages with specific data values (e.g., a string of data bits having a value of either logic 0 or logic 1). An erase operation is similar to a write operation, except that the erase operation re-programs an entire memory block or multiple memory blocks to the same data state (e.g., logic 0).

While the memory array 116 is described with respect to the memory cells, it is understood that the memory array 116 can include other components (not shown). For example, the memory array 116 can also include other circuit components, such as multiplexers, decoders, buffers, read/write drivers, address registers, data out/data in registers, etc., for accessing and/or programming (e.g., writing) the data and for other functionalities.

As described above, the memory system controller 114 can be configured to control the operations of the memory array 116. The memory system controller 114 can include a processor 122, such as a microcontroller, special purpose logic circuitry (e.g., a field programmable gate array (FPGA), an application specific integrated circuit (ASIC), etc.), or other suitable processor. The processor 122 can execute instructions encoded in hardware, firmware, and/or software (e.g., instructions stored in controller embedded memory 124 to execute various processes, logic flows, and routines for controlling operation of the memory system 102 and/or the memory array 116.

In some embodiments, the memory system controller 114 can include a buffer manager 126 configured to control and/or oversee information exchanged with the host device 104. The buffer manager 126 can interact with the host interface 112 regarding operations of receiving and/or transmitting buffers therein.

Further, the memory system controller 114 can further include an array controller 128 that controls or oversees detailed or targeted aspects of operating the memory array 116. For example, the array controller 128 can provide a communication interface between the processor 122 and the memory array 116 (e.g., the components therein). The array controller 128 can function as a multiplexer/demultiplexer, such as for handling transport of data along serial connection to flash devices in the memory array 116.

In controlling the operations of the memory system 102, the memory system controller 114 (via, e.g., the processor 122 and the embedded memory 124) can implement a Flash Translation Layer (FTL) 130. The FTL 130 can include a set of functions or operations that provide translations for the memory array 116 (e.g., the Flash devices therein). For example, the FTL 130 can include the logical-physical address translation, such as by providing the mapping between virtual or logical addresses used by the operating system to the corresponding physical addresses that identify the Flash device and the location therein (e.g., the layer, the page, the block, the row, the column, etc.). Also, the FTL 130 can include a garbage collection function that extracts useful data from partially filed units (e.g., memory blocks) and combines them to a smaller set of memory units. The FTL 130 can include other functions, such as wear-leveling, bad block management, concurrency (e.g., handling concurrent events), page allocation, error correction code (e.g., error recovery), or the like.

3D Storage Architecture

Figure 2:
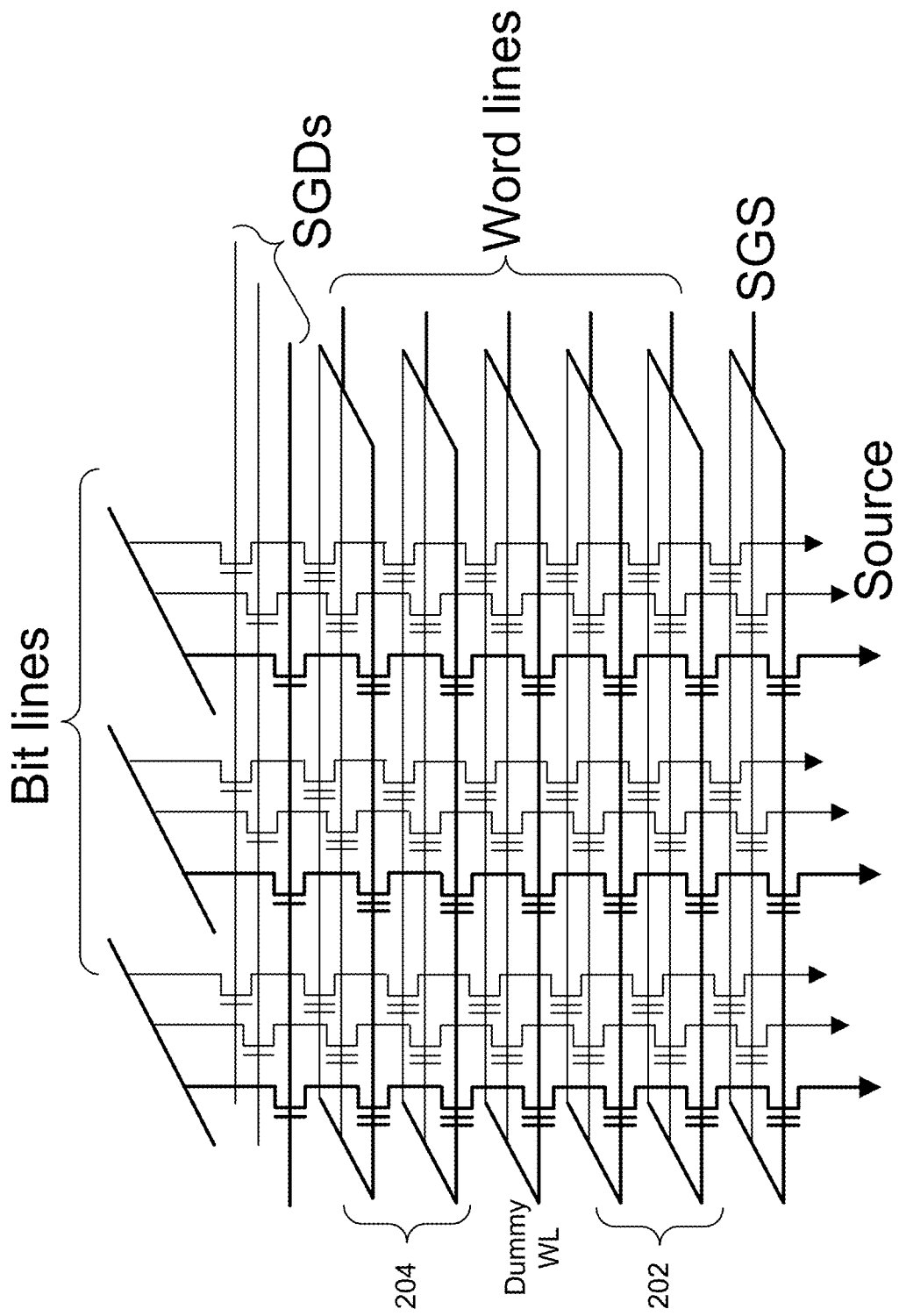
FIG. 2 is an illustration of a three-dimensional (3D) memory architecture in accordance with an embodiment of the present technology.

In some embodiments, the memory system 102 can include a 3D NAND system. The memory array 116 can include 3D NAND packages, and the memory system controller 114 can be configured accordingly. FIG. 2 is an illustration of a 3D memory architecture in accordance with an embodiment of the present technology. The 3D memory architecture can have the memory cells arranged along multiple stacked planes or horizontal layers. The memory planes may be connected using vertical channels. For the example illustrated in FIG. 2, the NAND packages within the memory array 116 can include bit lines extending vertically and across the stacked planes. The NAND packages can further include drain-end select gates (SGDs) at a top portion/layer and source-end select gates (SGSs) at a bottom portion/layer. The layers between the SGDs and correspond to the word lines and the layers of memory cells. The 3D NAND packages can include 64, 88, 96, 256, or 512 layers or more.

The 3D NAND layers may be further grouped into two or more decks, which may be separated or defined by dummy word lines (e.g., one dummy layer) disposed between the adjacent decks. The different decks can provide physical subgroupings within functional groupings, such as memory blocks and/or pages. For example, each memory block (e.g., QLC blocks) may be separated into halves for a two-deck 3D NAND architecture.

Based on the subgroupings, memory cells within a given functional grouping may be operated on at different times. Continuing with the example, a first deck 202 (e.g., the lower deck) of a QLC block may be programmed initially, and a second deck 204 (e.g., the upper deck) of the QLC block may be programmed after a processing delay. In some embodiments, the processing delay can correspond to a real-time demand or usage of the memory system 102. For example, the processing delay can correspond to the duration needed for write data to fill the cache memory (e.g., SLC memory) to a predetermined threshold amount that triggers a background data transfer from the cache memory to the QLC block. Accordingly, the processing delay may be unpredictable and may persist for relatively long periods of time, such as in hours. With the block remaining open during such long durations, the initially programmed set of memory cells can experience charge loss (e.g., loss of electrons from charge layer). Such charge loss can create an imbalance in the charge levels across the different decks within the same functional grouping.

Figure 3A:
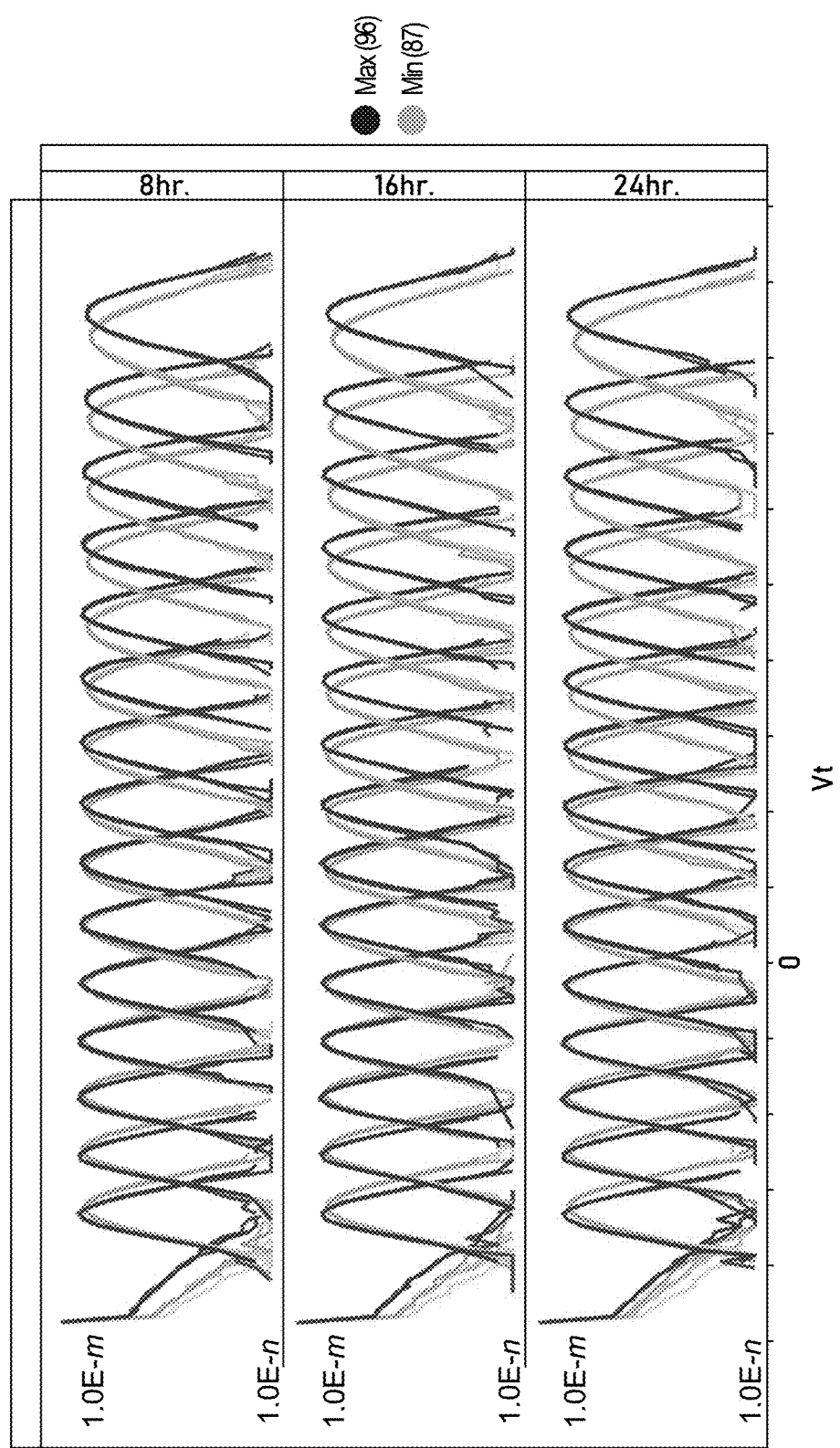
FIG. 3A is an illustration of changes in stored charge levels associated with delayed and unbalanced operations.

FIG. 3A is an illustration of changes in stored charge levels associated with delayed and unbalanced operations. FIG. 3A illustrates the threshold voltage (Vt) distribution for upper and lower decks corresponding to different processing delays (e.g., 8, 16, and 24 hours). As the set of graphs show, the charge loss in the earlier-programmed cells shift the corresponding Vt distributions farther away (e.g., to the left) from the later-programmed cells as the delay increases.

Figure 3B:
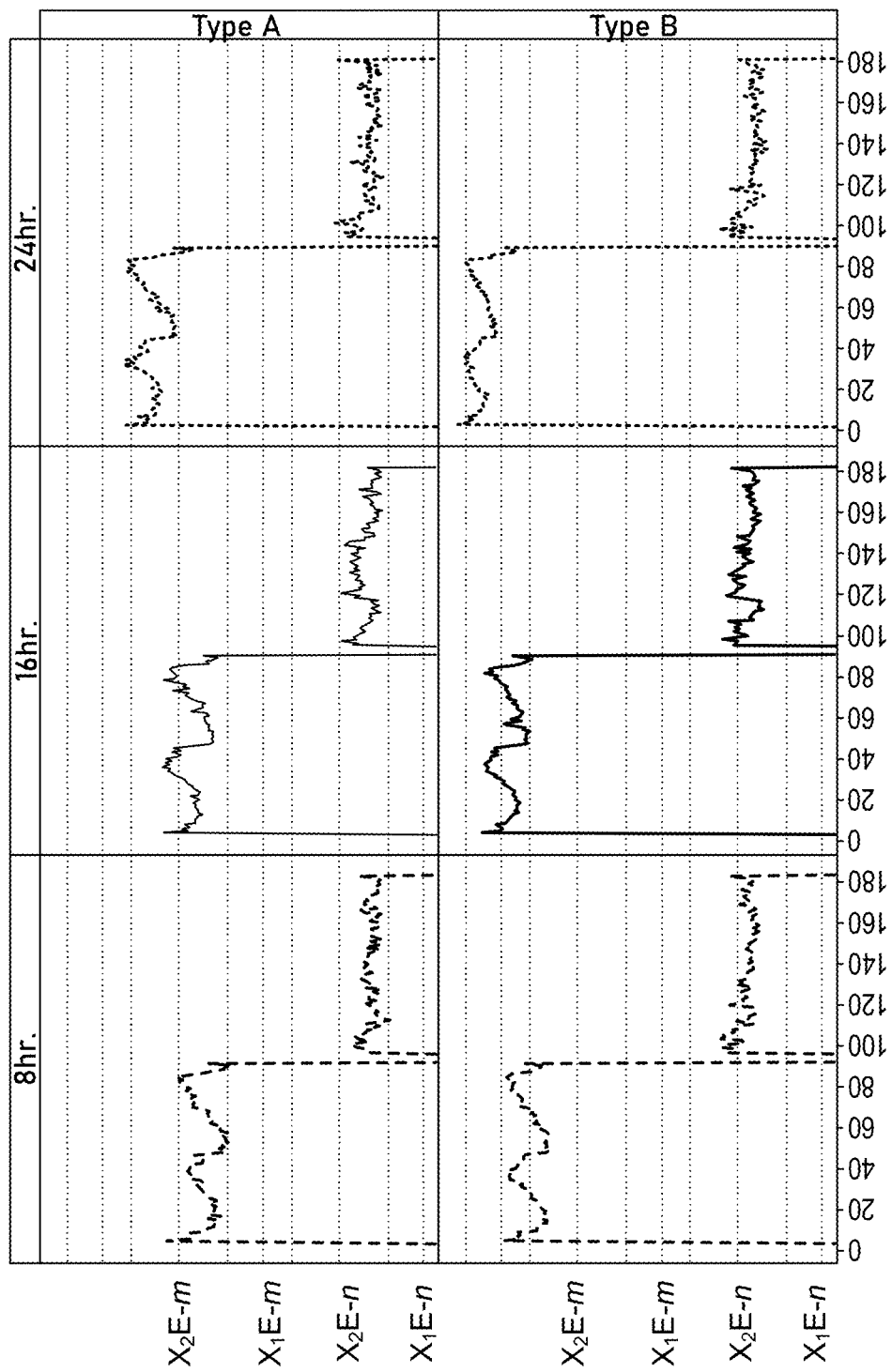
FIG. 3B is an illustration of errors associated with the delayed and unbalanced operations.

Such charge imbalance can cause operating errors (e.g., read errors) when using conventional processes. FIG. 3B is an illustration of errors associated with the delayed and unbalanced operations. FIG. 3B illustrates the raw bit error rate (Rber) associated with different word lines for the processing delays illustrated in FIG. 3A. As FIG. 3B shows, word lines of the first deck 202 correspond to higher Rber measurements than the word lines of the second deck 204. As an illustrative example, conventional memory systems may use a uniform predetermined read level to read the cells within a given block. Such uniform read level may cause read errors, (due to, e.g., erroneously reading from the memory cells in the second deck 204) when the Vt distributions between the different decks are separated by more than a threshold voltage range. In other words, a single read level may be insufficient to account for the deviations in the Vt across the different decks.

As such, the memory system 102 of FIG. 1 (via, e.g., the processor 122 and/or the controller embedded memory 124) can include a time-based read level management mechanism configured to dynamically adjust the read levels across the different decks based on the processing delay (e.g., cross-deck programming delay). Referring back to FIG. 1, the memory system 102 can include a set of different read levels, such as a default read level 152 and/or a dynamic read level 154. The memory system 102 can use the default read level 152 or the dynamic read level 154 as a basis in computing a deck-specific read level. In some embodiments, the memory system 102 can dynamically select between the different types of read levels for basis in computing the deck-specific read level.

The default read level 152 can correspond to a predetermined read level that may be established during manufacturing or before deployment of the memory system 102. The dynamic read level 154 can correspond to a read level that is derived during deployment/operation of the memory system 102. In some embodiments, the memory system 102 (via, e.g., the memory system controller 114 and/or the memory array 116) can determine the dynamic read level 154 based on applying a voltage pulse and measuring the reaction at the memory cells. For example, the memory system 102 can determine a quantity of bits/memory cells with Vt greater than the applied voltage pulse. Accordingly, the memory system 102 can determine the highest Vt that can be used to compute the dynamic read level 154. The memory system 102 can store the dynamic read level 154 for the corresponding set of memory cells (e.g., for each memory block). The memory system 102 can determine/update the dynamic read level 154 according to a triggering condition, such as a predetermined interval, a targeted operation (e.g., before or following a read operation), or a combination thereof.

To compute and implement a deck-specific read level or a deck-specific adjustment to one or more read levels, the memory system 102 can track a deck separation delay 156 between programming events for the different decks. For example, the memory system 102 can begin counting (via, e.g., a clock counter) when the first deck 202 of FIG. 2 is programmed. The memory system 102 can stop counting when the second deck 204 of FIG. 2 is programmed. The memory system 102 can set the value of the counter as the deck separation delay 156 across the first and second decks within a memory block. Alternatively, the memory system 102 can log the time of each programming event and calculate the deck separation delay 156 as the difference in the logged times.

The memory system 102 can use the deck separation delay 156 to identify a deck offset 158. The deck offset 158 can correspond to an offset value for computing the deck-specific read level. The deck offset 158 can represent a difference in the amount of charge loss between the initially programmed deck (e.g., the first deck 202) and the subsequently programmed deck (e.g., the second deck 204).

In some embodiments, the memory system 102 can use the deck separation delay 156 to identify the corresponding value of the deck offset 158 listed on a lookup table (LUT).

Figure 4:
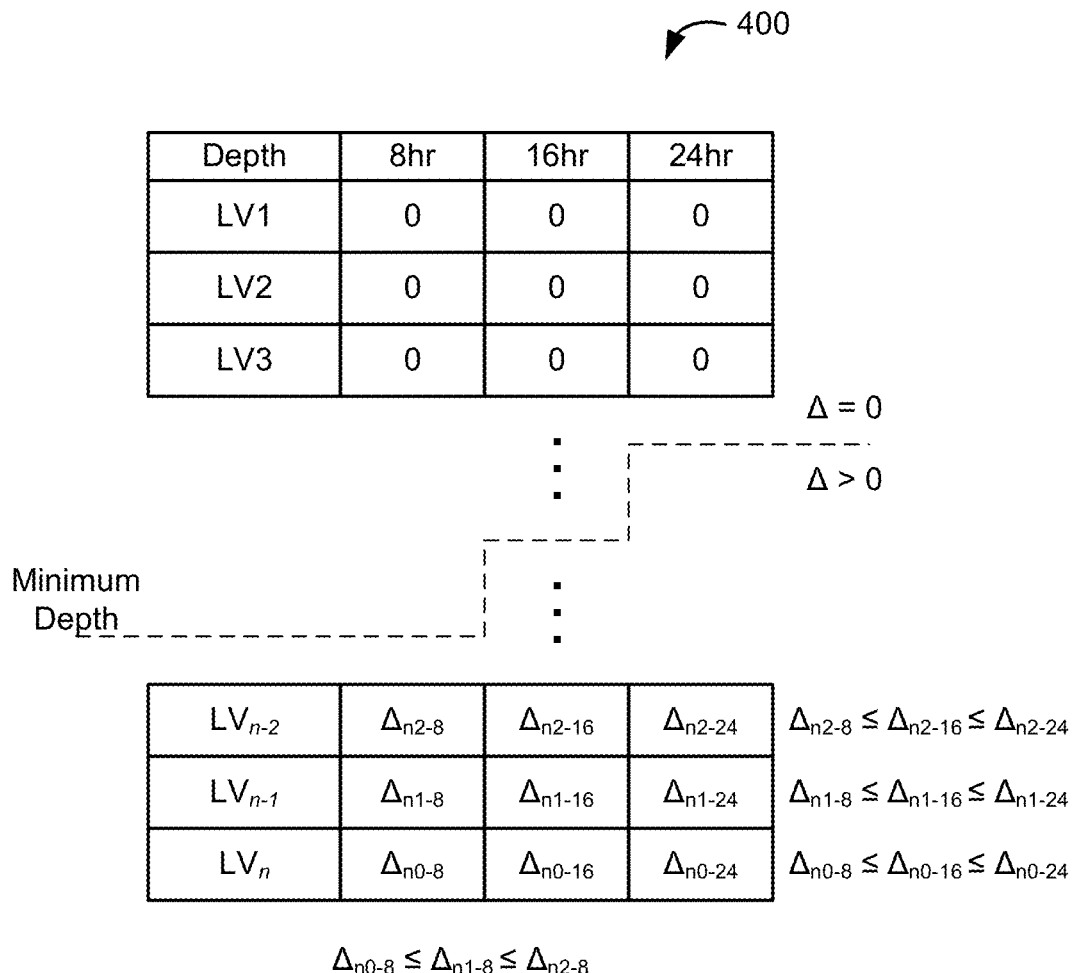
FIG. 4 is an illustration of an example offset table in accordance with an embodiment of the present technology.

FIG. 4 is an illustration of an example offset table 400 in accordance with an embodiment of the present technology. The offset table 400 can include the LUT that specifies different values of the deck separation delay 156 for different values of the deck separation delay 156. For the example illustrated in FIG. 4, the offset table 400 can include different offset values for 8 hours, 16 hours, and 24 hours of delay. The offset table 400 can include the offset values for each level or plane within the deck. The offset table 400 may include the offset values that increase as the separation delay increases and/or as the levels change across a predetermined direction. Additionally or alternatively, the memory system 102 can identify the deck offset 158 by calculating the deck offset 158 by inputting the deck separation delay 156 into a predetermined equation. For example, when the deck separation delay 156 does not match (e.g., below a listed minimum or between adjacent ones of) the delay amounts listed in the offset table 400, the memory system 102 can compute the deck offset 158 using the deck separation delay 156 and/or the adjacent offset value(s). In other embodiments, the memory system 102 can compute the deck offset 158 directly using the deck separation delay 156 and without using the offset table 400.

In some embodiments, the memory system 102 can use the deck offset 158 to compute deck-specific read levels. For example, the memory system 102 can compute a first read level 162 configured for reading data from the first deck 202 and a second read level 164 for configured for reading data from the second deck 204. The memory system 102 can compute the first read level 162 and/or the second read level 164 based on combining a base read level, such as the default read level 152 or the dynamic read level 154, with the deck offset 158. As an illustrative example, the memory system 102 can compute (1) the first read level 162 as a combination of the dynamic read level 154 and the deck offset 158 and (2) the second read level 164 as the dynamic read level 154.

The memory system 102 can further update the read level voltages (e.g., the first read level 162 and the second read level 164), such as by fine-tuning the voltage after a leveling process during the read operation. For example, the memory system 102 can use a tuning voltage (e.g., 0-16 mV or 32 mV) as an increment for a fine-tuning adjustment to the read level. The memory system 102 can leverage page-level reads to determine or apply the tuning voltage, such as by applying several reads and incrementally adjusting/applying the values or instances of the tuning voltage during the actual read time.

Figure 5:
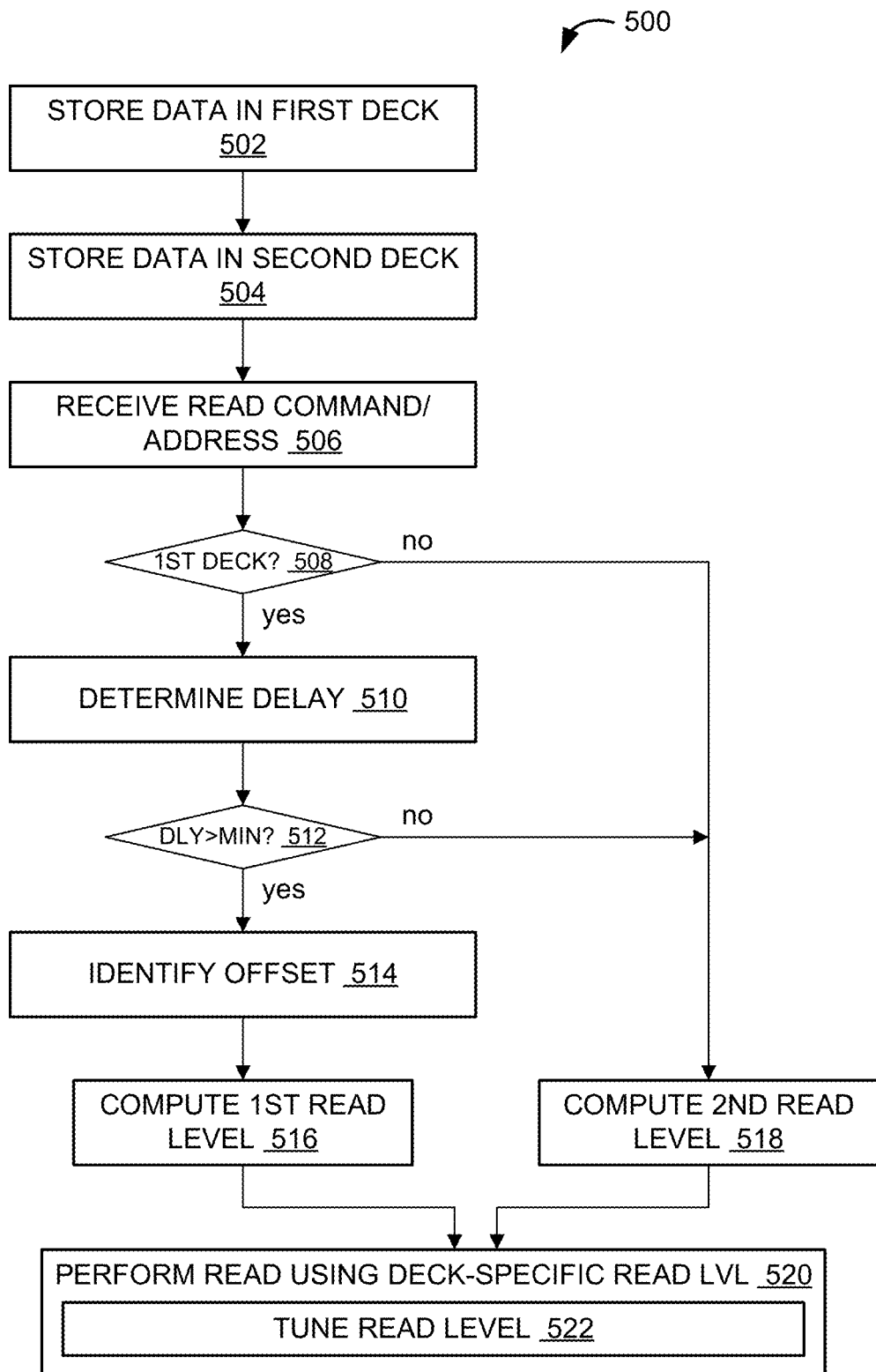
FIG. 5 is a flow diagram illustrating an example method of operating an apparatus in accordance with an embodiment of the present technology.

FIG. 5 is a flow diagram illustrating an example method 500 of operating an apparatus (e.g., the computing system 100, the memory system 102, and/or the memory system controller 114, all illustrated in FIG. 1) in accordance with an embodiment of the present technology. The method 500 can be for computing and implementing different/independent read levels across the different decks.

At block 502, the apparatus can store or program data in the first deck 202 of FIG. 2 (e.g., the lower deck). At block 504, the apparatus can store data in the second deck 204 of FIG. 2 (e.g., the upper deck). The apparatus can store a second set of data to the second deck 204 after storing a first set of data to the first deck 202. In some embodiments, the apparatus can initially store write data into cache memory (e.g., SLC cells). When the data written to the cache memory reaches a threshold amount, the memory system 102 can transfer the data from the cache memory to the QLC storage cell. Accordingly, the second set of data can be written to the second deck 204 after a delay that corresponds to a duration associated with the incoming write data reaching the cache memory threshold. As described above, the delay can cause an imbalance in the charge loss and the resulting stored charge levels. In other words, the first deck 202 can experience greater charge loss than the second deck 204 due to the delay in writing to the second deck 204.

In some embodiments, the apparatus can store the times (e.g., time stamps) for the programming events at the first deck 202 and the second deck 204. In other embodiments, the apparatus can begin counting based on programming to the first deck 202 and stop counting based on programming to the second deck 204.

At block 506, the apparatus can initiate a read operation. Accordingly, the memory system 102 can receive a corresponding read command and address. At decision block 508, the memory system 102 can determine whether the targeted location of the read operation is in the first deck 202. In other words, the memory system 102 can determine whether the read location is within a deck that was written first or before other decks.

When the read operation targets the first deck, the memory system 102 can determine a delay associated with the programming operations as illustrated in block 510. For example, the memory system 102 can access the counter to obtain the deck separation delay 156 of FIG. 1. Alternatively, the memory system 102 can calculate a difference between the programming times (e.g., the time stamps).

At decision block 512, the memory system 102 can determine whether the deck separation delay 156 exceeds a minimum delay threshold (e.g., a minimum delay value in the offset table 400 of FIG. 4. When the deck separation delay 156 exceeds the minimum delay threshold, the memory system 102 can determine that the delay is sufficient to cause at least a threshold amount of charge loss. Accordingly, at block 514, the memory system 102 can identify an offset value (e.g., the deck offset 158). The memory system 102 can identify the deck offset 158 based on accessing the offset table 400. The memory system 102 can identify the deck offset 158 as the value in the offset table 400 that corresponds to the deck separation delay 156. Alternatively or additionally, the memory system 102 can adjust the accessed value and/or directly calculate the deck offset 158 using the deck separation delay 156 as described above.

At block 516, the memory system 102 can compute the first read level 162 of FIG. 1 for use in reading from the commanded location in the first deck 202. In some embodiments, the memory system 102 can compute the first read level 162 by combining or adjusting the base read level (e.g., the default read level 152 of FIG. 1 or the dynamic read level 154 of FIG. 1) with the deck offset 158.

When the commanded read location is not in the first deck or when the programming delay is not greater than the minimum threshold, the memory system 102 can compute a second read level 164 of FIG. 1 as illustrated in block 518. In other words, the memory system 102 can compute the second read level 164 (e.g., instead of the first read level 162) when the read location is in the subsequently written deck or when the delay duration is insufficient to cause a meaningful or at least a threshold amount of charge loss. In some embodiments, the memory system 102 can compute the second read level 164 as the base read level (e.g., without the adjustment).

As an illustrative example, embodiments of the present technology have been described as adjusting the first read level 162 with a negative value for the deck offset 158. However, it is understood that the memory system 102 can operate differently by adjusting the second read level 164 and/or by using a positive offset value.

At block 520, the memory system 102 can perform the read operation using the deck-specific read level. In other words, the memory system 102 can (1) use the first read level 162 to read from the first deck 202 when the delay is sufficient, (2) use the second read level 164 to red from the first deck 202 when the delay is insufficient, or (3) use the second read level 164 to read from the second deck 204. In some embodiments, the memory system 102 can fine-tune the deck-specific read level. For example, the memory system 102 can use the result of the blocks 516 or 518 for the initial leveling process. After leveling, the memory system 102 can use a tuning voltage (e.g., 0-16 mV or 32 mV) as an increment for a fine-tuning adjustment to the read level up or down. The memory system 102 can leverage page-level reads to determine or apply the tuning voltage, such as by applying several reads and incrementally adjusting/applying the values or instances of the tuning voltage in executing the read operation.

In some embodiments, the computing system can determine the offset values for different delay durations during or as a part of manufacturing, testing, and/or other pre-deployment process(es). For example, the computing system can vary the delays between the first and second decks. Afterwards, the computing system can determine the charge levels (e.g., the highest Vt) for each deck or levels therein. The computing system can use the determined charge levels to compute the offset values. The computing system can use the computed offset values to derive the offset table 400. Accordingly, the memory system 102 can be loaded with the offset table 400. In other embodiments, the computing system can determine/update the offset table 400 dynamically. For example, the computing system can incrementally adjust the values in the offset table 400 based on results (e.g., error rates) from periodic internal/background reads, Vt measurements, and/or the like.

The memory system 102 computing and using deck-specific read levels (e.g., the first and second read levels that are different/independent from each other and used to read from the first and second decks, respectively) can account for real-time conditions associated with the data retention shift related to the charge losses occurring during the delay between writes to the different decks. Accordingly, the memory system 102 can provide reduced error rates, increased data integrity, and increased read efficiencies via the deck-specific read levels. Moreover, the memory system 102 can leverage one or more existing processes, such as the background reads, the read offset maintenance, or the like, to compute the deck-specific read levels. Accordingly, the memory system 102 can provide the benefits using minimal additional processing, circuitry, and other resources. Further, the memory system 102 can provide the benefits without affecting the quality of service (QoS) measure for the memory system 102.

Figure 6:
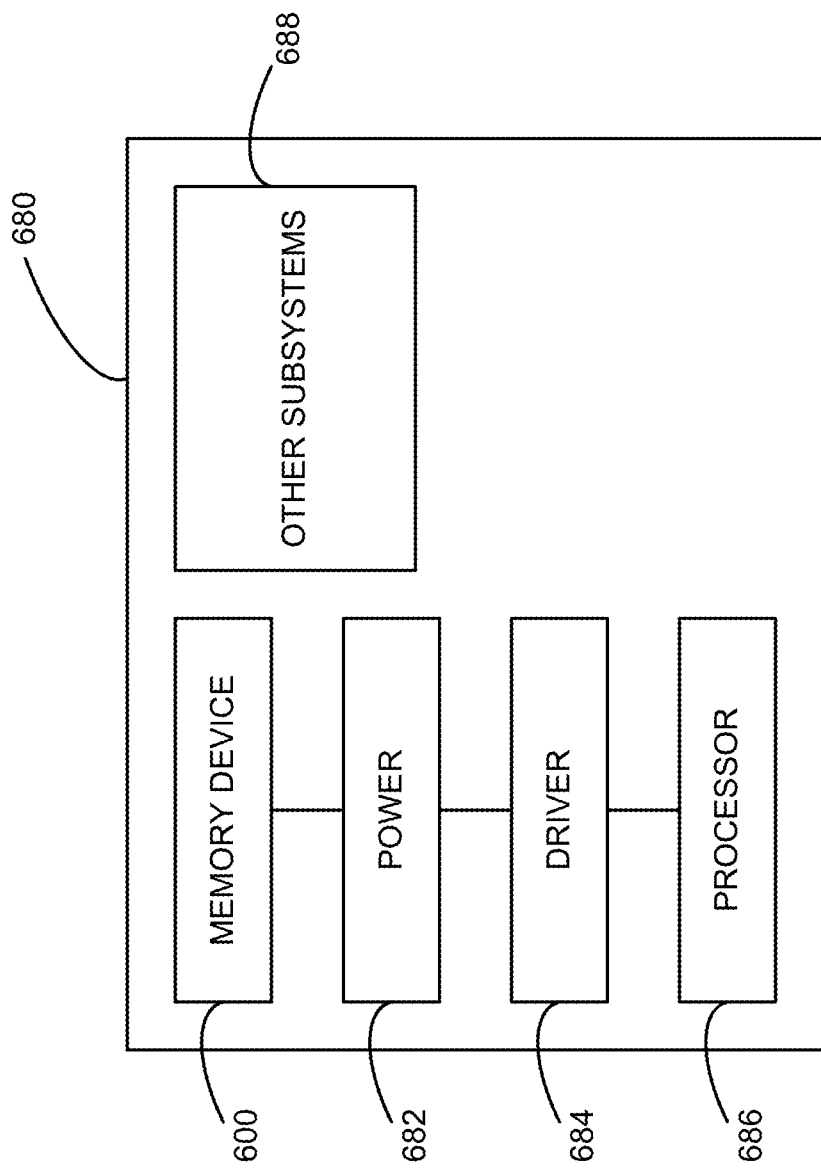
FIG. 6 is a schematic view of a system that includes an apparatus in accordance with an embodiment of the present technology.

FIG. 6 is a schematic view of a system that includes an apparatus in accordance with embodiments of the present technology. Any one of the foregoing apparatuses (e.g., memory devices) described above with reference to FIGS. 1-5 can be incorporated into any of a myriad of larger and/or more complex systems, a representative example of which is system 680 shown schematically in FIG. 6. The system 680 can include a memory device 600, a power source 682, a driver 684, a processor 686, and/or other subsystems or components 688. The memory device 600 can include features generally similar to those of the apparatus described above with reference to one or more of the FIGS, and can therefore include various features for performing a direct read request from a host device. The resulting system 680 can perform any of a wide variety of functions, such as memory storage, data processing, and/or other suitable functions. Accordingly, representative systems 680 can include, without limitation, hand-held devices (e.g., mobile phones, tablets, digital readers, and digital audio players), computers, vehicles, appliances and other products. Components of the system 680 may be housed in a single unit or distributed over multiple, interconnected units (e.g., through a communications network). The components of the system 680 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of NAND Flash devices. Apparatuses configured in accordance with other embodiments of the present technology, however, can include other types of suitable storage media in addition to or in lieu of NAND Flash devices, such as, devices incorporating NOR-based non-volatile storage media (e.g., NAND flash), magnetic storage media, phase-change storage media, ferroelectric storage media, dynamic random access memory (DRAM) devices, etc.

The term "processing" as used herein includes manipulating signals and data, such as writing or programming, reading, erasing, refreshing, adjusting or changing values, calculating results, executing instructions, assembling, transferring, and/or manipulating data structures. The term data structure includes information arranged as bits, words or code-words, blocks, files, input data, system-generated data, such as calculated or generated data, and program data. Further, the term "dynamic" as used herein describes processes, functions, actions or implementation occurring during operation, usage, or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to one or more of the FIGS. described above.

We claim:

1. A memory device, comprising:
   a memory array including memory cells configured to store data, wherein the memory cells are grouped into at least a first deck and a second deck; and a memory system controller operably coupled to the memory array and configured to—
program the first deck before the second deck;
determine a deck separation delay representative of a duration between programming the first and second decks;
identify an offset level based on the deck separation delay, wherein the offset level represents an imbalance in charge loss across the first and second decks during the deck separation delay;
determine a base read level for reading from the first deck, the second deck, or a combination thereof; and
compute a deck-specific read level based on the base read level, the offset level, or a combination thereof.

2. The memory device of claim 1, wherein:
the memory array includes a three-dimensional (3D) Flash architecture having a memory block including the first and second decks; and
the memory system controller is configured to compute (1) a first read level configured for reading from the first deck within the memory block and (2) a second read level configured for reading from the second deck within the memory block.

3. The memory device of claim 1, wherein the memory system controller is configured to:
compute a first read level based on adjusting the base read level by the offset level, wherein the first read level is configured for reading from the first deck within the memory block; and
compute a second read level based on the base read level, wherein the second read level is configured for reading from the second deck within the memory block.

4. The memory device of claim 3, wherein the memory system controller is configured to dynamically derive the base read level according to one or more real-time characteristics of the memory array.

5. The memory device of claim 4, wherein the memory system controller is configured to:
determine a highest threshold voltage within a block of memory cells based on applying one or more voltage pulses to the memory block, wherein the memory block includes the first and second decks; and
dynamically derive the dynamic read level for the memory block based on the highest threshold voltage, wherein
the offset level is a negative value.

6. The memory device of claim 1, wherein the memory system controller is configured to compute the deck-specific read level for the first deck based on the base read level and without using the offset level when the deck separation delay fails to satisfy a minimum threshold, wherein the offset level is a negative value.

7. The memory device of claim 1, wherein the memory system controller is configured to identify the offset level based on identifying at least one value that corresponds to the deck separation delay on a lookup table (LUT).

8. The memory device of claim 7, wherein the memory system controller is configured to identify the offset level based on adjusting the value from the LUT according to (1) the deck separation delay, (2) one or more adjacent values corresponding to corresponding discrete time values that surround the deck separation delay, (3) a predetermined rounding process for the deck separation delay, or a combination thereof.

9. The memory device of claim 7, wherein the LUT corresponds to at least one of the decks and includes for each deck a set of adjustment values that correspond to different discrete delay durations, wherein the set of adjustment values maintain either an increasing pattern or a decreasing pattern (1) as the discrete delay durations increase and/or (2) as the level depth increases.

10. The memory device of claim 1, wherein the memory system controller is configured to further fine-tune the deck-specific read level using a predetermined increment, a set of read operations, or a combination thereof.

11. A memory controller, comprising:
at least one processor;
embedded memory coupled to the processor and storing instructions for execution by the at least one processor, the instructions comprising—
controlling operations of a memory array to program a first deck before a second deck of a memory block of the memory array;
determining a deck separation delay according to a duration between programming the first and second decks;
identifying an offset level based on the deck separation delay, wherein the offset level represents an imbalance in charges stored at the first and second decks due to the deck separation delay; and
dynamically computing a deck-specific read level based on a base read level, the offset level, or a combination thereof to account for the imbalance in the stored charges.

12. The memory controller of claim 11, wherein the processor instructions include:
dynamically determining the base read level according to a highest threshold voltage within the memory block.

13. The memory controller of claim 12, wherein the deck-specific read level for the second deck is computed based the base read level and without adjusting by the offset level.

14. The memory controller of claim 12, wherein the deck-specific read level for the first deck is computed based on based the base read level and without adjusting by the offset level when the deck separation delay fails to satisfy a minimum threshold.

15. The memory controller of claim 12, wherein the deck-specific read level for the first deck is computed based on adjusting the base read level by the offset level when the deck separation delay is greater than a minimum threshold.

16. A method of operating a memory array that includes memory cells grouped into at least a first deck and a second deck, the method comprising:
determining a deck separation delay that represents a duration between programming the first and second decks;
identifying an offset level based on the deck separation delay, wherein the offset level represents an imbalance in charges stored at the first and second decks due to the deck separation delay; and
dynamically computing a deck-specific read level based on a base read level, the offset level, or a combination thereof.

17. The method of claim 16, further comprising:
dynamically determining the base read level according to a real-time condition or a history thereof for the memory array.

18. The method of claim 16, wherein identifying the offset level includes identifying an adjustment value that corresponds to the deck separation delay on a lookup table (LUT).

19. The method of claim 16, wherein dynamically computing the deck-specific read level includes decreasing the base read level by the offset level for reading from the first deck.

20. The method of claim 19, wherein dynamically computing the deck-specific read level includes decreasing the base read level when (1) the deck separation delay satisfies a minimum threshold and/or (2) a targeted storage location satisfies a minimum depth.

* * * * *